United States Patent [19]
Iima et al.

[11] Patent Number: 5,686,853
[45] Date of Patent: Nov. 11, 1997

[54] DRIVER CIRCUITRY ADJUSTED TO ALLOW HIGH SPEED DRIVING AND REDUCE POTENTIAL VARIATIONS OF INTERCONNECTIONS

[75] Inventors: Tomofumi Iima; Masakazu Yamashina; Masayuki Mizuno, all of Tokyo, Japan

[73] Assignee: NEC Corporation, Tokyo, Japan

[21] Appl. No.: 580,485

[22] Filed: Dec. 29, 1995

[30] Foreign Application Priority Data

Jan. 4, 1995 [JP] Japan ................................. 7-000068

[51] Int. Cl.$^6$ ................................. H03K 19/20
[52] U.S. Cl. .................. 327/374; 327/108; 327/365; 327/437; 326/87
[58] Field of Search .................... 327/108, 111, 327/437, 374, 365, 379, 392; 326/82, 83, 86, 87, 17, 20

[56] References Cited

U.S. PATENT DOCUMENTS 5,471,150  11/1995  Jung et al. ................................. 326/87

*Primary Examiner*—Timothy P. Callahan
*Assistant Examiner*—Dinh T. Le
*Attorney, Agent, or Firm*—Young & Thompson

[57] ABSTRACT

The present invention provides a driver circuitry having a single input terminal for receiving an input signal of binary digits consisting of high and low levels, and at least first and second output terminals, wherein the input signal is varied almost linearly in a first time period so as to be shifted between high and low levels, the driver circuitry comprises first and second control circuits. The first control circuit is coupled to the input terminal for receiving the input signal. The first control circuit is also coupled to the first output terminal for outputting a first output signal of binary digits via the first output terminal. The first control circuit is biased between a high voltage line which supplies a high level of voltage and a low voltage line which supplies a low level of voltage. The first control circuit is adjusted to shift the first output signal between the high and low levels within an initial period of the first time period and then keep the first output signal at the shifted one of the low and high levels until after the first time period expired. The second control circuit is coupled to the input terminal for receiving the input signal. The second control circuit is also coupled to the second output terminal for outputting a second output signal of binary digits via the second output terminal. The second control circuit is biased between the high voltage line and the low voltage line. The second control circuit is adjusted to keep the second output signal at one level of the low and high levels at least until the time approaches the termination of the first time period and then shift the second output signal from the one level to another level within a second time period which is short as the initial period of the first time period.

8 Claims, 8 Drawing Sheets

DRIVER CIRCUITRY ADJUSTED TO ALLOW HIGH SPEED DRIVING AND REDUCE POTENTIAL VARIATIONS OF INTERCONNECTIONS

BACKGROUND OF THE INVENTION

1. Field of the Invention

The present invention provides a driver circuitry adjusted to allow a high speed driving by reducing a time delay of signals due to a large resistance and a large capacitance and also adjusted to suppress undesirable potential variations of interconnections due to a capacitive coupling.

2. Description of the Related Art

One of the conventional high speed driver circuits will be described with reference to FIGS. 1, 2A and 2B. FIG. 1 is a circuit diagram illustrative of the circuit configuration of the conventional high speed driver circuits. FIG. 2 is a timing chart of input and output signals. The conventional high speed driver circuit comprises input and output terminals IN and OUT, three p-channel MOS transistors T601, T602, and T603, and three n-channel MOS transistors T604, T605, and T606, and a delay circuit D601. The input terminal is provided to receive an input binary digit signal. The gate of the p-channel MOS transistor T601 is coupled to the input terminal IN to receive the input signal. The source of the p-channel MOS transistor T601 is coupled to a high voltage line which is provided to supply a power to the driver circuit. The gate of the p-channel MOS transistor T603 is coupled to the input terminal IN to receive the input signal. The source of the p-channel MOS transistor T603 is coupled to the drain of the p-channel MOS transistor T601. The drain of the p-channel MOS transistor T603 is coupled to the output terminal OUT. The gate of the n-channel MOS transistor T604 is coupled to the input terminal IN to receive the input signal. The drain of the n-channel MOS transistor T604 is coupled to the drain of the p-channel MOS transistor T603 and also coupled to the output terminal OUT. The gate of the n-channel MOS transistor T605 is coupled to the input terminal IN to receive the input signal. The drain of the n-channel MOS transistor T605 is coupled to the source of the n-channel MOS transistor T604. The source of the n-channel MOS transistor T605 is coupled to the ground line to receive the ground potential. From the above descriptions, the p-channel and n-channel MOS transistors T601, T603, T604 and T605 are connected in series between the high voltage line and the ground line. The delay circuit D601 is connected to the input terminal IN but not coupled to the output terminal OUT. The delay circuit D601 is configured so as to invert the binary digit signal and to cause a time delay in outputting the inverted signal. Thus, the input signal is received and inverted by the delay circuit D601. The output of the inverted signal from the delay circuit D601 is delayed. The gate of the p-channel MOS transistor T602 is coupled to the output side of the delay circuit to receive the inverted signal from the delay circuit D601. The source of the p-channel MOS transistor T602 is coupled to the source of the p-channel MOS transistor T601. The drain of the p-channel MOS transistor T602 is coupled to the drain of the p-channel MOS transistor T601. The drain of the p-channel MOS transistor T602 is also coupled to the source of the p-channel MOS transistor T602. The gate of the n-channel MOS transistor T606 is coupled to the output side of the delay circuit D601 to receive the inverted signal from the delay circuit D601. The source of the n-channel MOS transistor T606 is coupled to the source of the n-channel MOS transistor T605. The source of the n-channel MOS transistor T606 is also coupled to the ground line to receive the ground potential. The drain of the n-channel MOS transistor T606 is coupled to the drain of the n-channel MOS transistor T605.

The operations of the above conventional high speed driver circuit will be described with reference to FIG. 2A. Prior to a time T1, the input signal INPUT remains in the low level. When the time becomes T1, the input signal INPUT is initiated to be raised almost linearly and not so rapidly and is kept raised until the input signal INPUT becomes the high level at a time T3. The delay signal DELAY SIGNAL outputted from the delay circuit D601 remains in the high level until the same is rapidly dropped to the low level at the time T3. The delay signal DELAY SIGNAL outputted from the delay circuit D601 is to be inputted into the gates of the p-channel and n-channel MOS transistors T602 and T606.

When the input signal INPUT is in the low level and the delay signal DELAY SIGNAL outputted from the delay circuit D601 is in the high level, then the p-channel transistors T601 and T603 remain in the ON state while the n-channel MOS transistors T604 and T605 remain in the OFF state. At this time, the p-channel transistor T602 is in the OFF state while the n-channel transistor T606 is in the ON state, As a result, the output terminal OUT becomes electrically connected to the high voltage line via the p-channel MOS transistors T601 and T603 which are in the ON state. The output terminal OUT becomes electrically disconnected from the ground line by the n-channel MOS transistor T604 which is in the OFF state. The potential of the output terminal OUT is in the high level.

When the input signal INPUT is initiated to be raised linearly and gradually and then the time becomes T2, the p-channel MOS transistors T601 and T603 turn OFF and further the n-channel MOS transistor T604 turns ON while the n-channel MOS transistor T606 still remains ON. As a result, the output terminal OUT is made electrically connected to the ground line via the n-channel MOS transistors T604 and T606 but disconnected from the high voltage line. Thus, the potential of the output terminal OUT is dropped to the low level. At this time, the input signal has a voltage level which may be considered as a threshold voltage Vth. Therefore, it can be understood that the driver circuit has the threshold voltage Vth.

The voltage level of the input signal INPUT is continuously and linearly raised until the time becomes T3 and the voltage level thereof becomes the high level. A time difference between T1 and T2 is smaller than a time difference between T2 and T3. For this reason, a difference of the threshold voltage Vth from the low level is smaller than that from the high level. This means that the threshold voltage level Vth is near to the low level rather than the high level.

With reference to FIG. 2B, prior to the time T1, the input signal INPUT remains in the high level. When the time becomes T1, the input signal INPUT is initiated to be dropped almost linearly and not so rapidly and is kept dropped until the input signal INPUT becomes the low level at the time T3. The delay signal DELAY SIGNAL outputted from the delay circuit D601 remains in the low level until the same is rapidly raised up to the high level at the time T3. The delay signal DELAY SIGNAL outputted from the delay circuit D601 is to be inputted into the gates of the p-channel and n-channel MOB transistors T602 and T606.

When the input signal INPUT is in the high level and the delay signal DELAY SIGNAL outputted from the delay circuit D601 is in the low level, then the p-channel transistors T601 and T603 remain in the OFF state while the n-channel MOS transistors T604 and T605 remain in the ON state. At this time, the p-channel transistor T602 is in the ON state while the n-channel transistor T606 is in the OFF state. As a result, the output terminal OUT becomes electrically disconnected from the high voltage line by the p-channel MOS transistor T603 which is in the OFF state. The output terminal OUT also becomes electrically connected to the ground line via the n-channel MOS transistors T604 and T605 which are in the ON state. The potential of the output terminal OUT is in the low level.

When the input signal INPUT is initiated to be dropped linearly and gradually and then the time becomes T2, the p-channel MOS transistor T601 turns ON and further the n-channel MOS transistors T604 and T605 turn OFF while the p-channel MOS transistor T602 still remains ON. As a result, the output terminal OUT is made electrically disconnected from the ground line, but connected to the high voltage line via the p-channel transistors T602 and T603. Thus, the potential of the output terminal OUT is raised up to the high level. At this time, the input signal has the voltage level which may be considered as a threshold voltage Vth for the driver circuit.

The voltage level of the input signal INPUT is continuously and linearly dropped until the time becomes T3 and the voltage level thereof becomes the low level. A time difference between T1 and T2 is smaller than a time difference between T2 and T3. For this reason, a difference of the threshold voltage Vth from the low level is larger than that from the high level. This means that the threshold voltage level Vth is near to the high level rather than the low level. The threshold voltage Vth, when the input signal voltage level is raised from the low level to the high level, is higher than that when the input signal voltage level is dropped from the high level to the low level.

The above conventional driver circuit has the following disadvantages. The delay circuit D601 is designed to provide a time delay in outputting the output signal so as to match the time interval during which the input signal voltage level is switched between the high and low levels. The time delay in outputting the output signal from the delay circuit is not variable. For this reason, even if the time interval, during that the input signal voltage level is switched between the high and low levels, is varied, then the time delay in outputting the output signal from file delay circuit remains unchanged. The time interval, during that the input signal voltage level, defines the available frequency range of the input signal. This means that the conventional driver circuit is not operational provided that the frequency of the input signal is smaller than the predetermined time interval, to which the time delay in outputting the inverted signal from the delay circuit corresponds.

In the prior art, there is no driver circuit which is responsible for variations in the frequency of the input signal, particularly responsible for an extremely high frequency input signal.

SUMMARY OF THE INVENTION

Accordingly, it is an object of the present invention to provide a novel driver circuit which is free from the disadvantages as described above.

It is a further object of the present invention to provide a novel driver circuit responsible for variations in the frequency of the input signal, particularly responsible for an extremely high frequency input signal.

It is still a further object of the present invention to provide a novel driver circuit adjusted to allow a high speed driving by reducing a time delay of signals due to a larger resistance and a large capacitance.

It is yet a further object of the present invention to provide a novel driver circuit adjusted to suppress undesirable potential variations of interconnections due to a capacitive coupling.

The above and other objects, features and advantages of the present invention will be apparent from the following descriptions.

The present invention provides a driver circuitry having a single input terminal for receiving an input signal of binary digits consisting of high and low levels, and at least first and second output terminals, wherein the input signal is varied almost linearly in a first time period so as to be shifted between high and low levels the driver circuitry comprises first and second control circuits.

The first control circuit is coupled to the input terminal for receiving the input signal. The first control circuit is also coupled to the first output terminal for outputting a first output signal of binary digits via the first output terminal. The first control circuit is biased between a high voltage line which supplies a high level of voltage and a low voltage line which supplies a low level of voltage. The first control circuit is adjusted to shift the first output signal between the high and low levels within an initial period of the first time period and then keep the first output signal at the shifted one of the low and high levels until after the first time period expired.

The second control circuit is coupled to the input terminal for receiving the input signal. The second control circuit is also coupled to the second output terminal for outputting a second output signal of binary digits via the second output terminal. The second control circuit is biased between the high voltage line and the low voltage line. The second control circuit is adjusted to keep the second output signal at one level of the low and high levels at least until the time approaches the termination of the first time period and then shift file second output signal from the one level to another level within a second time period which is short as the initial period of the first time period.

Further, there is provided a third control circuit being coupled to the fifth output terminal for outputting a fifth output signal via the fifth output terminal. The third control circuit is also coupled to the input terminal for receiving the input signal. The third control circuit is also coupled to the first output terminal for receiving the first output signal from the first control circuit. The third control circuit is also coupled to the second output terminal for receiving the second output signal from the second control circuit. The third control circuit is biased between the high voltage line and the low voltage line. The third control circuit is adjusted to confirm, with reference to the first and second output signals, whether the input signal is being shifted from the low level to the high level or shifted from the high level to the low level, so that the third control circuit varies the filth output signal almost linearly within an initial half of the first time period so as to shift it from the low level to the high level if the input signal is shifted from the low level to the high level, and so that the third control circuit varies the fifth output signal almost linearly within the initial half of the first time period so as to shift it from the high level to the low level if the input signal is shifted from the high level to the low level.

BRIEF DESCRIPTIONS OF THE DRAWINGS

Preferred embodiments according to the present invention will be described in detail with reference to the accompanying drawings.

DISCLOSURE OF THE INVENTION

Figure 1:
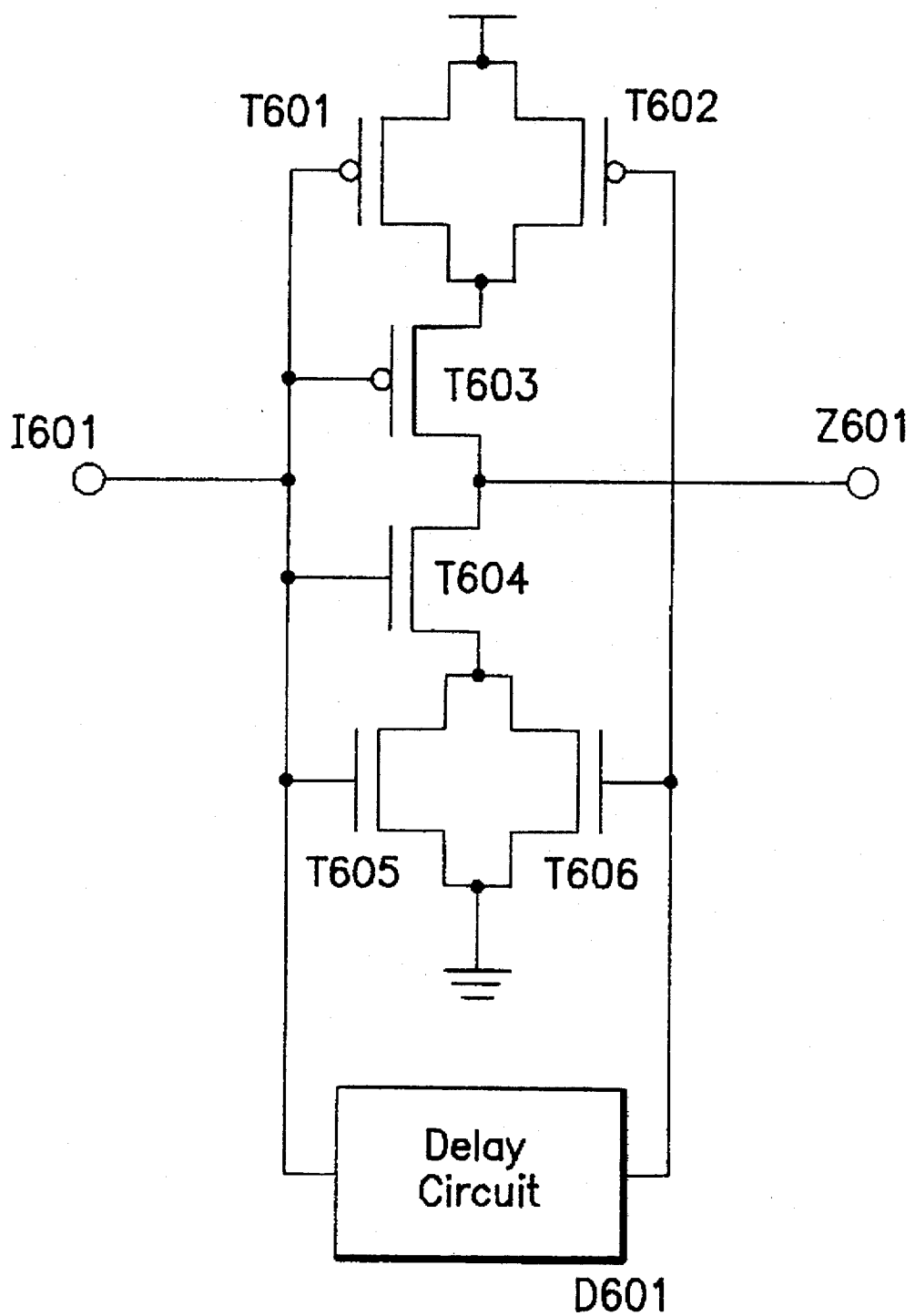
FIG. 1 is a circuit diagram illustrative of the conventional driver circuitry.
Figure 2A:
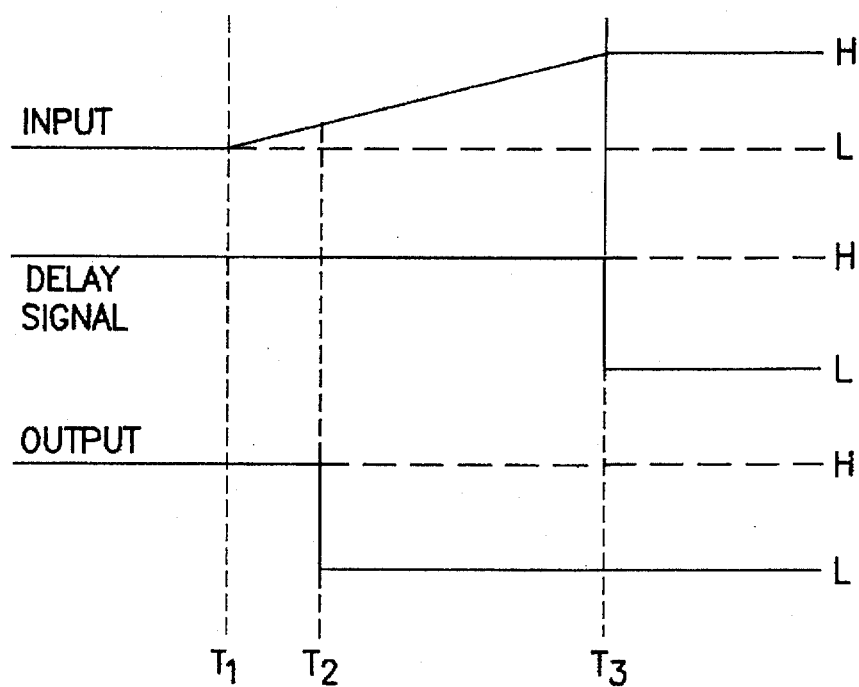
FIGS. 2A and 2B are timing charts illustrative of operations of the conventional driver circuit of FIG. 1.
Figure 2B:
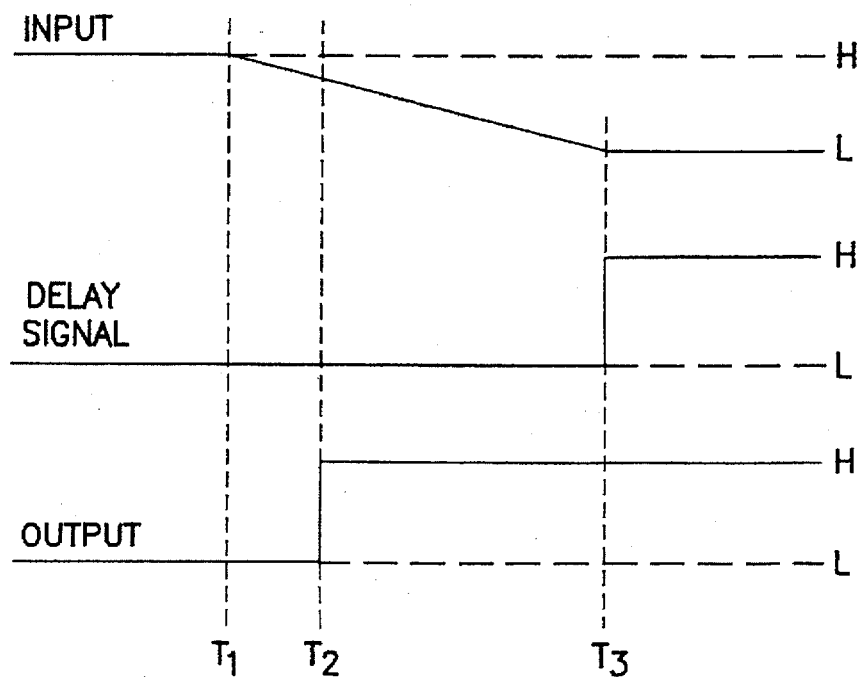

The present invention provides a driver circuit having a single input terminal for receiving an input signal of binary digits consisting of high and low levels, and at least first and second output terminals, wherein the input signal is varied almost linearly in a first time period so as to be shifted between high and low levels the driver circuitry comprises first and second control circuits.

The first control circuit is coupled to the input terminal for receiving the input signal. The first control circuit is also coupled to the first output terminal for outputting a first output signal of binary digits via the first output terminal. The first control circuit is biased between, a high voltage line which supplies a high level of voltage and a low voltage line which supplies a low level of voltage. The first control circuit is adjusted to shift the first output signal between the high and low levels within an initial period of first time period and then keep the first output signal at the shifted one of the low and high levels until after the first time period expired.

The second control circuit is coupled to the input terminal for receiving the input signal. The second control circuit is also coupled to the second output terminal for outputting a second output signal of binary digits via the second output terminal. The second control circuit is biased between the high voltage line and the low voltage line. The second control circuit is adjusted to keep the second output signal at one level of the low and high levels at least until the time approaches the termination of the first time period and then shift the second output signal from the one level to another level within a second time period which is short as the initial period of the first time period.

It is available that the first control circuit is adjusted to shift the first output signal from the low level to the high level within the initial period provided that the input signal is shifted from the low level to the high level, and adjusted to shift the first output signal from the high level to the low level within the initial period provided that the input signal is shifted from the high level to the low level.

It is also available that the first control circuit is adjusted to shift the first output signal from the low level to the high level within the initial period provided that the input signal is shifted from the high level to the low level, and adjusted to shift the first output signal from the high level to the low level within the initial period provided that the input signal is shifted from the low level to the high level.

It is also available to further provide a third output terminal being coupled to the first control circuit, wherein the first control circuit is adjusted to output a third output signal which is inverse to the first output signal.

It is also available that the second control circuit is adjusted to shift the second output signal from the low level to the high level within the second time period provided that the input signal is shifted from the low level to the high level, and adjusted to shift the second output signal from the high level to the low level within the second time period provided that the input signal is shifted from the high level to the low level.

It is also available that the second control circuit is adjusted to shift the second output signal from the low level to the high level within the second time period provided that the input signal is shifted from the high level to the low level, and adjusted to shift the second output signal from the high level to the low level within the second time period provided that the input signal is shifted from the low level to the high level.

It is also available to further provide a fourth output terminal being coupled to the second control circuit, wherein the second control circuit is adjusted to output a fourth output signal which is inverse to the second output signal. In this case, it is preferable that the first control circuit comprises the following elements. There is provided a first p-channel MOS transistor has a gate coupled to the input terminal, a source coupled to the high voltage line and a drain coupled to the first output terminal. There is also provided a first n-channel MOS transistor has a gate coupled to the input terminal, a source coupled to the low voltage line and a drain coupled to the first output terminal. There is also provided a second p-channel MOS transistor having a gate coupled to the fourth output terminal, a source coupled to the input terminal and a drain. There is also provided a second n-channel MOS transistor having a gate coupled to the fourth output terminal, a source coupled to the input terminal and a drain. There is also provided a third p-channel MOS transistor having a gate coupled to the fourth output terminal, a source coupled to the high voltage line and a drain coupled to the drain of the second n-channel MOS transistor. There is also provided a third n-channel MOS transistor having a gate coupled to the fourth output terminal, a source coupled to the low voltage line and a drain coupled to the drain of the second p-channel MOS transistor. There is also provided a fourth p-channel MOS transistor having a gate coupled to the drain of the second n-channel MOS transistor, a source coupled to the high voltage line and a drain coupled to the first output terminal. There is also provided a fourth n-channel MOS transistor having a gate coupled to the drain of the second p-channel MOS transistor, a source coupled to the low voltage line and a drain coupled to the first output terminal.

The second control circuit comprises the following elements. There is provided a fifth p-channel MOS transistor having a gate coupled to the input terminal, a source coupled to the high voltage line and a drain. There is also provided a fifth n-channel MOS transistor having a gate coupled to the input terminal, a source coupled to the low voltage line and a drain. There is also provided a sixth p-channel MOS transistor having a gate coupled to the input terminal, a source coupled to the drain of the fifth p-channel MOS transistor and a drain coupled to the second output terminal. There is also provided a sixth n-channel MOS transistor having a gate coupled to the input terminal, a source coupled to the drain of the fifth n-channel MOS transistor and a drain coupled to the second output terminal. There is also provided a seventh p-channel MOS transistor having a gate coupled to the second output terminal, a source coupled to the source of the sixth p-channel MOS transistor and a drain coupled to the low voltage line. There is also provided a seventh n-channel MOS transistor having a gate coupled to the second output terminal, a source coupled to the source of the sixth n-channel MOS transistor and a drain coupled to the high voltage line. There is also provided an eighth p-channel MOS transistor having a gate coupled to the second output terminal, a source coupled to the high voltage line and a drain coupled to the fourth output terminal. There is also provided an eighth n-channel MOS transistor having a gate coupled to rite second output terminal, a source coupled to the low voltage line and a drain coupled to the fourth output terminal.

It is available to further provide a fifth output terminal and a third control circuit being coupled to the fifth output terminal for outputting a fifth output signal via the fifth output terminal. The third control circuit is also coupled to the input terminal for receiving the input signal. The third control circuit is also coupled to the first output terminal for receiving the first output signal from the first control circuit. The third control circuit is also coupled to the second output terminal for receiving the second output signal from the second control circuit. The third control circuit is biased between the high voltage line and the low voltage line. The third control circuit is adjusted to confirm, with reference to the first and second output signals, whether the input signal is being shifted from the low level to the high level or shifted from the high level to the low level, so that the third control circuit varies the fifth output signal almost linearly within an initial half of the first time period so as to shift it from the low level to the high level if the input signal is shifted from the low level to the high level, and so that the third control circuit varies the fifth output signal almost linearly within the initial half of the first time period so as to shift it from the high level to the low level if the input signal is shifted from the high level to the low level.

It is also available to further provide a fourth output terminal being coupled to the second control circuit, wherein the second control circuit is adjusted to output a fourth output signal which is inverse to the second output signal. In this case, it is preferable that the first control circuit comprises the following elements. There is provided a first p-channel MOS transistor has a gate coupled to the input terminal, a source coupled to the high voltage line and a drain coupled to the first output terminal. There is also provided a first n-channel MOS transistor has a gate coupled to the input terminal, a source coupled to the low voltage line and a drain coupled to the first output terminal. There is also provided a second p-channel MOS transistor having a gate coupled to the fourth output terminal, a source coupled to the input terminal and a drain. There is also provided a second n-channel MOS transistor having a gate coupled to the fourth output terminal, a source coupled to the input terminal and a drain. There is also provided a third p-channel MOS transistor having a gate coupled to the fourth output terminal, a source coupled to the high voltage line and a drain coupled to the drain of the second n-channel MOS transistor. There is also provided a third n-channel MOS transistor having a gate coupled to the fourth output terminal, a source coupled to the low voltage line and a drain coupled to the drain of the second p-channel MOS transistor. There is also provided a fourth p-channel MOS transistor having a gate coupled to the drain of the second n-channel MOS transistor, a source coupled to the high voltage line and a drain coupled to the first output terminal. There is also provided a fourth n-channel MOS transistor having a gate coupled to the drain of the second p-channel MOS transistor, a source coupled to the low voltage line and a drain coupled to the first output terminal.

The second control circuit comprises the following elements. There is provided a fifth p-channel MOS transistor having a gate coupled to the input terminal, a source coupled to the high voltage line and a drain. There is also provided a fifth n-channel MOS transistor having a gate coupled to the input terminal, a source coupled to the low voltage line and a drain. There is also provided a sixth p-channel MOS transistor having a gate coupled to the input terminal, a source coupled to the drain of the fifth p-channel MOS transistor and a drain coupled to the second output terminal. There is also provided a sixth n-channel MOS transistor having a gate coupled to the input terminal, a source coupled to the drain of the fifth n-channel MOS transistor and a drain coupled to the second output terminal. There is also provided a seventh p-channel MOS transistor having a gate coupled to the second output terminal, a source coupled to the source of the sixth p-channel MOS transistor and a drain coupled to the low voltage line. There is also provided a seventh n-channel MOS transistor having a gate coupled to the second output terminal, a source coupled to the source of the sixth n-channel MOS transistor and a drain coupled to the high voltage line. There is also provided an eighth p-channel MOS transistor having a gate coupled to the second output terminal, a source coupled to the high voltage line and a drain coupled to the fourth output terminal. There is also provided an eighth n-channel MOS transistor having a gate coupled to the second output terminal, a source coupled to the low voltage line and a drain coupled to the fourth output terminal.

The third control circuit comprises the following elements. There is provided a ninth p-channel MOS transistor having a gate coupled to the first output terminal, a source coupled to the high voltage line and a drain. There is also provided a ninth n-channel MOS transistor having a gate coupled to the first output terminal, a source coupled to the low voltage line and a drain. There is also provided a tenth p-channel MOS transistor having a gate coupled to the second output terminal, a source coupled to the drain of the ninth p-channel MOS transistor and a drain coupled to the fifth output terminal. There is also provided a tenth n-channel MOS transistor having a gate coupled to the second output terminal, a source coupled to the drain of the ninth n-channel MOS transistor and a drain coupled to the fifth output terminal.

The present invention also provides another driver circuitry being connected between a power supply line which supplies a high level of voltage and a ground line which supplies the ground potential. The driver circuitry has a single input terminal for receiving an input signal of binary digits consisting of high and ground levels, and at least first and second output terminals. The input signal is varied almost linearly in a first time period so as to be shifted between high and ground levels. The driver circuitry comprises first and second switching elements.

The first switching circuit is coupled to the input terminal for receiving the input signal. The first switching circuit is also coupled to the first output terminal for outputting a first output signal of binary digits via the first output terminal. The first switching circuit is connected between the power supply line and the ground line so as to be biased by the high level of voltage. The first switching circuit is adjusted to switch the first output signal between the high and ground levels within an initial period of the first time period and then keep the first output signal at the switched one of the ground and high levels until after the first time period expired.

The second switching circuit is coupled to the input terminal for receiving the input signal. The second switching circuit is also coupled to the second output terminal for outputting a second output signal of binary digits via the second output terminal. The second switching circuit is connected between the power supply line and the ground line so as to be biased by the high level of voltage. The second switching circuit is adjusted to keep the second output signal at one level of the ground and high levels at least until the time approaches the termination of the first time period and then switch the second output signal from the one level to another level within a second time period which is short as the initial period of the first time period.

It is available that the first switching circuit is adjusted to switch the first output signal from the ground level to the high level within the initial period by connecting the first output terminal to the power supply line and disconnecting the first output terminal from the ground line provided that the input signal is switched from the ground level to the high level, and adjusted to switch the first output signal from the high level to the ground level within the initial period by connecting the first output terminal to the ground line and disconnecting the first output terminal from the power supply line provided that the input signal is switched from the high level to the ground level.

It is also available that the first switching circuit is adjusted to switch the first output signal from the ground level to the high level within the initial period by connecting the first output terminal to the power supply line and disconnecting the first output terminal from the ground line provided that the input signal is switched from the high level to the ground level, and adjusted to switch the first output signal from the high level to the ground level within the initial period by connecting the first output terminal to the ground line and disconnecting the first output terminal from the power supply line provided that the input signal is switched from the ground level to the high level.

It is also available to further provide a third output terminal being coupled to the first switching circuit, wherein file first switching circuit is adjusted to output a third output signal which is reverse to the first output signal.

It is also available that the second switching circuit is adjusted to switch the second output signal from the ground level to the high level within the second time period by connecting the first output terminal to the power supply line and disconnecting the first output terminal from the ground line provided that the input signal is switched from the ground level to the high level, and adjusted to switch the second output signal from the high level to the ground level within the second time period by connecting the first output terminal to the ground line and disconnecting the first output terminal from the power supply line provided that the input signal is switched from the high level to the ground level.

It is also available that the second switching circuit is adjusted to switch the second output signal from the ground level to the high level within the second time period by connecting the first output terminal to the power supply line and disconnecting the first output terminal from the ground line provided that the input signal is switched from the high level to the ground level, and adjusted to switch the second output signal from the high level to the ground level within the second time period by connecting the first output terminal to the ground line and disconnecting the first output terminal from the power supply line provided that the input signal is switched from the ground level to the high level.

It is also available to further provide a fourth culprit terminal being coupled to the second switching circuit, wherein the second switching circuit is adjusted to output a fourth output signal which is inverse to the second output signal. In this case, it is preferable that the first switching circuit comprises the following elements. There is provided a first p-channel MOS transistor having a gate coupled to the input terminal, a source coupled to the power supply line and a drain coupled to the first output terminal. There is also provided a first n-channel MOS transistor having a gate coupled to the input terminal, a source coupled to the ground line and a drain coupled to the first output terminal. There is provided a second p-channel MOS transistor having a gate coupled to the fourth output terminal, a source coupled to the input terminal and a drain. There is also provided a second n-channel MOS transistor having a gate coupled to the fourth output terminal, a source coupled to the input terminal and a drain. There is also provided a third p-channel MOS transistor having a gate coupled to the fourth output terminal, a source coupled to the power supply line and a drain coupled to the drain of the second n-channel MOS transistor. There is also provided a third n-channel MOS transistor having a gate coupled to the fourth output terminal, a source coupled to the ground line and a drain coupled to the drain of the second p-channel MOS transistor. There is also provided a fourth p-channel MOS transistor having a gate coupled to the drain of the second n-channel MOS transistor, a source coupled to the power supply line and a drain coupled to the first output terminal. There is also provided a fourth n-channel MOS transistor having a gate coupled to the drain of the second p-channel MOS transistor, a source coupled to the ground line and a drain coupled to the first output terminal.

The second switching circuit comprises the following elements. There is provided a fifth p-channel MOS transistor having a gate coupled to the input terminal, a source coupled to the power supply line and a drain. There is also provided a fifth n-channel MOS transistor having a gate coupled to the input terminal, a source coupled to the ground line and a drain. There is also provided a sixth p-channel MOS transistor having a gate coupled to the input terminal, a source coupled to the drain of the fifth p-channel MOS transistor and a drain coupled to the second output terminal. There is also provided a sixth n-channel MOS transistor having a gate coupled to the input terminal, a source coupled to the drain of the fifth n-channel MOS transistor and a drain coupled to the second output terminal. There is also provided a seventh p-channel MOS transistor having a gate coupled to the second output terminal, a source coupled to the source of the sixth p-channel MOS transistor and a drain coupled to the ground line. There is also provided a seventh n-channel MOS transistor having a gate coupled to the second output terminal, a source coupled to the source of the sixth n-channel MOS transistor and a drain coupled to the power supply line. There is also provided an eighth p-channel MOS transistor having a gate coupled to the second output terminal, a source coupled to the power supply line and a drain coupled to the fourth output terminal.

There is also provided an eighth n-channel MOS transistor having a gate coupled to the second output terminal, a source coupled to the ground line and a drain coupled to the fourth output terminal.

It is also available to further provide a fifth output terminal, and a third switching circuit being coupled to the fifth output terminal for outputting a fifth output signal via the fifth output terminal. The third switching circuit also is coupled to the input terminal for receiving the input signal. The third switching circuit is also coupled to the first output terminal for receiving the first output signal from the first switching circuit. The third switching circuit is also coupled to the second output terminal for receiving the second output signal from the second switching circuit. The third switching circuit is biased between the power supply line and the ground line. The third switching circuit is adjusted to confirm, with reference to the first and second output signals, whether the input signal is being switched from the ground level to the high level or switched from the high level to the ground level, so that the third switching circuit varies the fifth output signal almost linearly within an initial half of the first time period so as to switch it from the ground level to the high level if the input signal is switched from the ground level to the high level, and that the third switching circuit varies the fifth output signal almost linearly within the initial half of the first time period so as to switch it from the high level to the ground level if the input signal is switched from the high level to the ground level.

It is also available to further provide a fourth output terminal being coupled to the second switching circuit, wherein the second switching circuit is adjusted to output a fourth output signal which is reverse to the second output signal. In this case, it is preferable that the first switching circuit comprises the following elements. There is provided a first p-channel MOS transistor having a gate coupled to the input terminal, a source coupled to the power supply line and a drain coupled to the first output terminal. There is also provided a first n-channel MOS transistor having a gate coupled to the input terminal, a source coupled to the ground line and a drain coupled to the first output terminal. There is provided a second p-channel MOS transistor having a gate coupled to the fourth output terminal, a source coupled to the input terminal and a drain. There is also provided a second n-channel MOS transistor having a gate coupled to the fourth output terminal, a source coupled to the input terminal and a drain. There is also provided a third p-channel MOS transistor having a gate coupled to the fourth output terminal, a source coupled to the power supply line and a drain coupled to the drain of the second n-channel MOS transistor. There is also provided a third n-channel MOS transistor having a gate coupled to the fourth output terminal, a source coupled to the ground line and a drain coupled to the drain of the second p-channel MOS transistor. There is also provided a fourth p-channel MOS transistor having a gate coupled to the drain of the second n-channel MOS transistor, a source coupled to the power supply line and a drain coupled to the first output terminal. There is also provided a fourth n-channel MOS transistor having a gate coupled to the drain of the second p-channel MOS transistor, a source coupled to the ground line and a drain coupled to the first output terminal.

The second switching circuit comprises the following elements. There is provided a fifth p-channel MOS transistor having a gate coupled to the input terminal, a source coupled to the power supply line and a drain. There is also provided a fifth n-channel MOS transistor having a gate coupled to the input terminal, a source coupled to the ground line and a drain. There is also provided a sixth p-channel MOS transistor having a gate coupled to the input terminal, a source coupled to the drain of the fifth p-channel MOS transistor and a drain coupled to the second output terminal. There is also provided a sixth n-channel MOS transistor having a gate coupled to the input terminal, a source coupled to the drain of the fifth n-channel MOS transistor and a drain coupled to the second output terminal. There is also provided a seventh p-channel MOS transistor having a gate coupled to the second output terminal, a source coupled to the source of the sixth p-channel MOS transistor and a drain coupled to the ground line. There is also provided a seventh n-channel MOS transistor having a gate coupled to the second output terminal, a source coupled to the source of the sixth n-channel MOS transistor and a drain coupled to the power supply line. There is also provided an eighth p-channel MOS transistor having a gate coupled to the second output terminal, a source coupled to the power supply line and a drain coupled to the fourth output terminal. There is also provided an eighth n-channel MOS transistor having a gate coupled to the second output terminal, a source coupled to the ground line and a drain coupled to fourth output terminal.

The third switching circuit comprises the following elements. There is provided a ninth p-channel MOS transistor having a gate coupled to the first output terminal, a source coupled to the power supply line and a drain. There is also provided a ninth n-channel MOS transistor having a gate coupled to the first output terminal, a source coupled to the ground line and a drain. There is also provided a tenth p-channel MOS transistor having a gate coupled to the second output terminal, a source coupled to the drain of the ninth p-channel MOS transistor and a drain coupled to the fifth output terminal. There is also provided a tenth n-channel MOS transistor having a gate coupled to the second output terminal, a source coupled to the drain of the ninth n-channel MOS transistor and a drain coupled to the fifth output terminal.

DETAILED DESCRIPTION OF THE PREFERRED EMBODIMENTS

A first embodiment according to the present invention will be described in detail with reference to FIGS. 3, 4, 5A, and 5B. A driver circuit in a first embodiment according to the present invention will be described. The driver circuitry is connected between a power supply line which supplies a high level of voltage and a ground line which supplies the ground potential. The driver circuitry has a single input terminal I101 for receiving an input signal of binary digits consisting of high and ground levels H and L, and first, second and third output terminals Z101, Z102 and Z103. The input signal is varied almost linearly in a first time period defined between T1 and T2 so as to be shifted between high and ground levels as illustrated in FIGS. 5A and 5B. The driver circuitry comprises first and second control circuits C101 aud C102.

Figure 3:
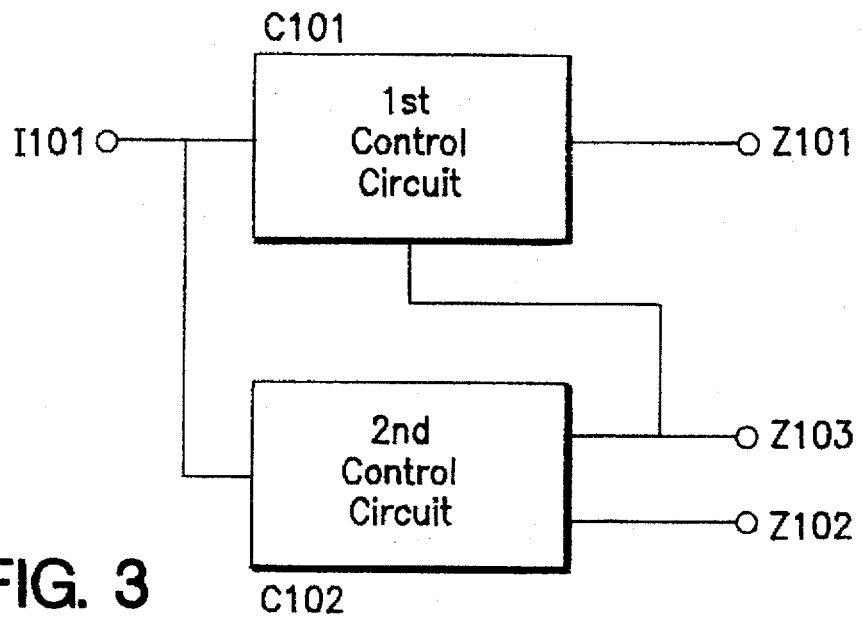
FIG. 3 is a block diagram illustrative of the essential part of a novel driver circuitry in a first embodiment according to the present invention.

As illustrated in FIG. 3, the first control circuit C101 is coupled to the input terminal I101 for receiving the input signal. The first control circuit C101 is also coupled to the first output terminal Z101 for outputting a first output signal of binary digits via the first output terminal Z101. The first control circuit C101 is connected between the power supply line (not illustrated) and the ground line (not illustrated) so as to be biased by the high level of voltage.

The second control circuit C102 is coupled to the input terminal I101 for receiving the input signal. The second control circuit C102 is also coupled to the second output terminal Z102 for outputting a second output signal of binary digits via the second output terminal Z102. The second control circuit C102 is also coupled to the third output terminal Z103 for outputting a third output signal of binary digits via the third output terminal Z103. The second control circuit C102 is connected between the power supply line (not illustrated) and the ground line not illustrated so as to be biased by the high level of voltage. The third output terminal is connected to the first control circuit C101.

As illustrated in FIGS. 5A and 5B, the first control circuit C101 is adjusted to switch the first output signal Z101 between the high and ground levels within an initial period of the first time period defined as between T1 and T2 and then keep the first output signal at the switched one of the ground and high levels until after the first time period expired. The first control circuit C101 is adjusted to switch the first output signal Z101' from the ground level L to the high level H within the initial period by connecting the first output terminal Z101' to the power supply line and disconnecting the first output terminal Z101' from the ground line provided that the input signal I101 is switched from the ground level to the high level as illustrated in FIG. 5A. The first control circuit C101 is also adjusted to switch the first output signal Z101 from the high level H to the ground level L within the initial period by connecting the first output terminal to the ground line and disconnecting the first output terminal from the power supply line provided that the input signal I101 is switched from the ground level L to the high level H as illustrated in FIG. 5A.

The first control circuit C101 is adjusted to switch the first output signal Z101' from the high level L to the ground level H within the initial period by connecting the first output terminal Z101' to the power supply line and disconnecting the first output terminal Z101' from the ground line provided that the input signal I101 is switched from the high level to the ground level as illustrated in FIG. 5B. The first control circuit C101 is also adjusted to switch the first output signal Z101 from the ground level L to the high level H within the initial period by connecting the first output terminal to the ground line and disconnecting the first output terminal from the power supply line provided that the input signal I101 is switched from the high level H to the ground level L as illustrated in FIG. 5B.

As illustrated in FIG. 5A, the second control circuit C102 is adjusted to keep the second output signal Z102 at the high level until the time becomes T2 and then switch the second output signal Z102 from the high level to the ground level within a second time period which is short as the initial period of the first time period defined as between T1 and T2. The second control circuit C102 is adjusted to switch the second output signal Z102 from the high level to the ground level within the second time period by connecting the second output terminal to the ground line and disconnecting the second output terminal from the power supply line provided that the input signal I101 is switched from the ground level to the high level.

As illustrated in FIG. 5B, the second control circuit C102 is adjusted to keep the second output signal Z102 at the ground level until the time becomes T2 and then switch the second output signal Z102 from the ground level to the high level within a second time period which is short as the initial period of the first time period defined as between T1 and T2. The second control circuit C102 is adjusted to switch the second output signal Z102 from the ground level to the high level within the second time period by connecting the second output terminal to the power supply line and disconnecting the second output terminal from the ground line provided that the input signal I101 is switched from the high level to the ground level.

As illustrated in FIG. 5A, the second control circuit C102 is further adjusted to keep the third output signal Z103 at the ground level until the time becomes T2 and then switch the third output signal Z103 from the ground level to the high level within the second time period which is short as the initial period of the first time period defined as between T1 and T2. The second control circuit C102 is adjusted to switch the third output signal Z103 from the ground level to the high level within the second time period by connecting the second output terminal to the power supply line and disconnecting the second output terminal from the ground line provided that the input signal I101 is switched from the Found level to the high level.

As illustrated in FIG. 5B, the second control circuit C102 is further adjusted to keep the third output signal Z103 at the high level until the time becomes T2 and then switch the third output signal Z103 from the high level to the ground level within the second time period which is short as the initial period of the first time period defined as between T1 and T2. The second control circuit C102 is adjusted to switch the third output signal Z103 from the high level to the ground level within the second time period by connecting the second output terminal to the ground line and disconnecting the second output terminal from the power supply line provided that the input signal I101 is switched from the high level to the ground level.

Figure 4:
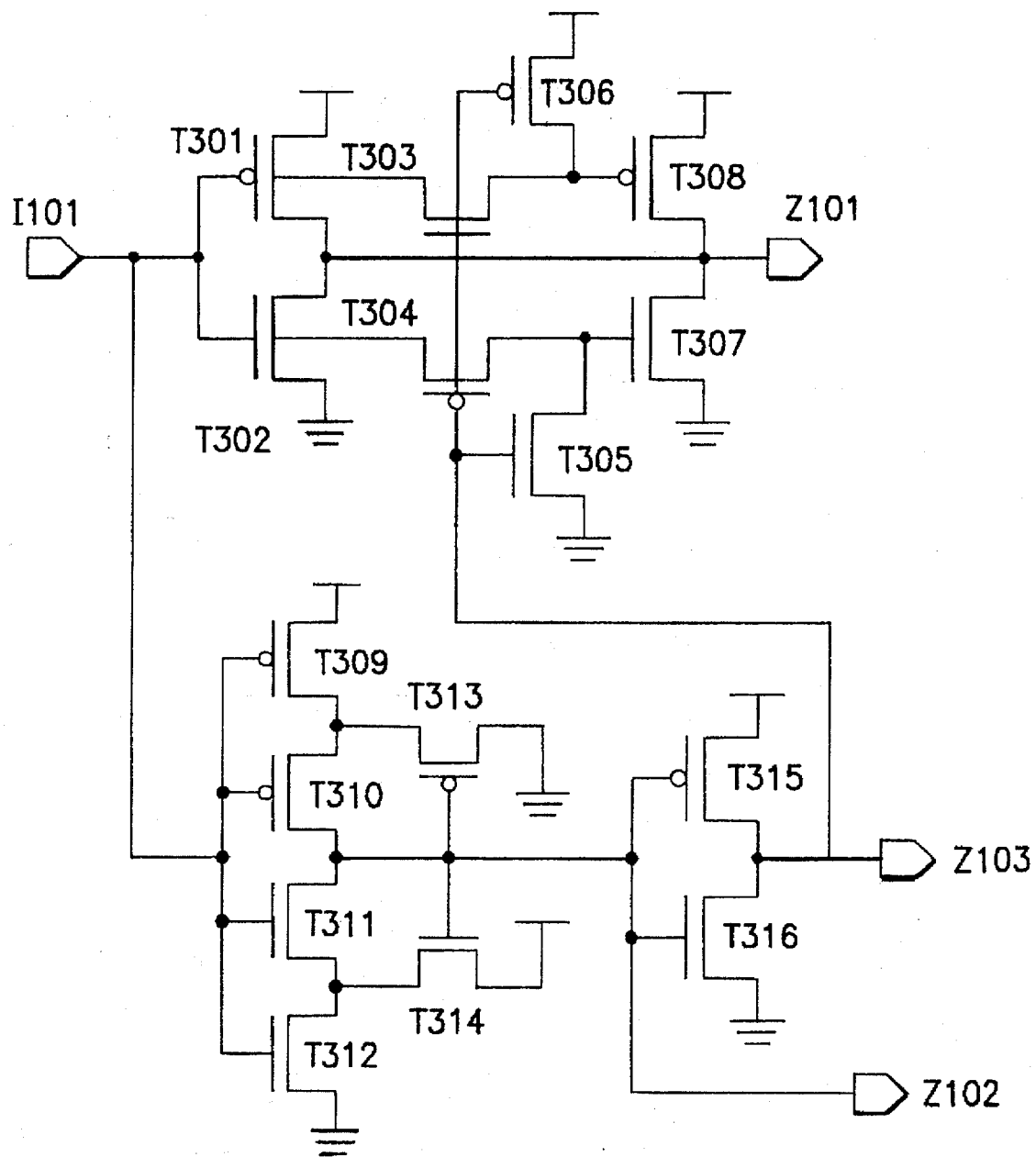
FIG. 4 is a circuit diagram illustrative of a novel driver circuitry in a first embodiment according to the present invention.
Figure 5A:
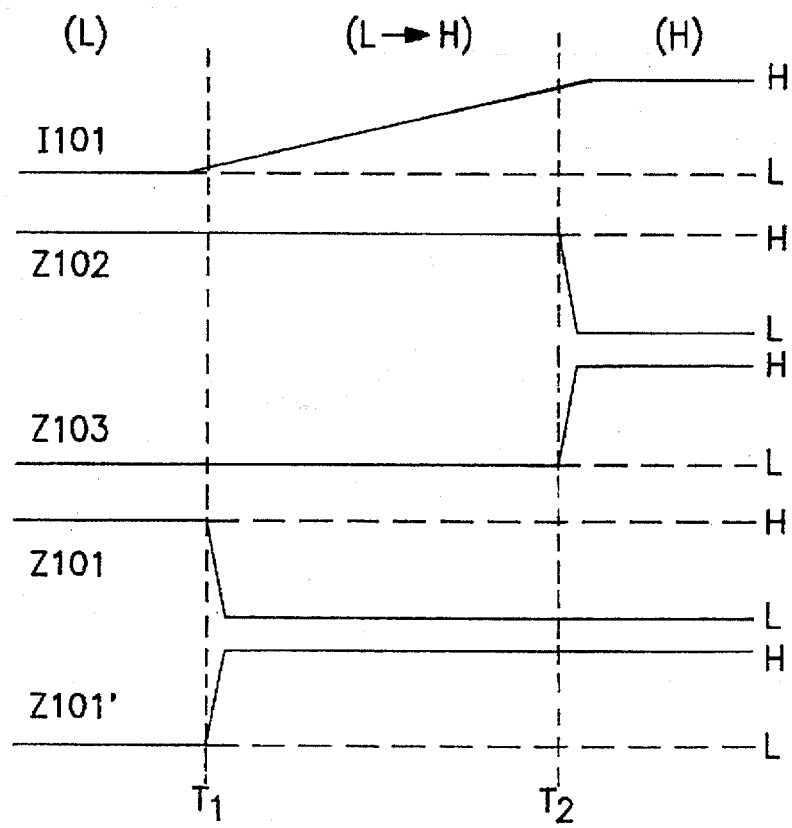
FIGS. 5A and 5B are timing charts illustrative of operations of a novel driver circuitry in a first embodiment according to the present invention.
Figure 5B:
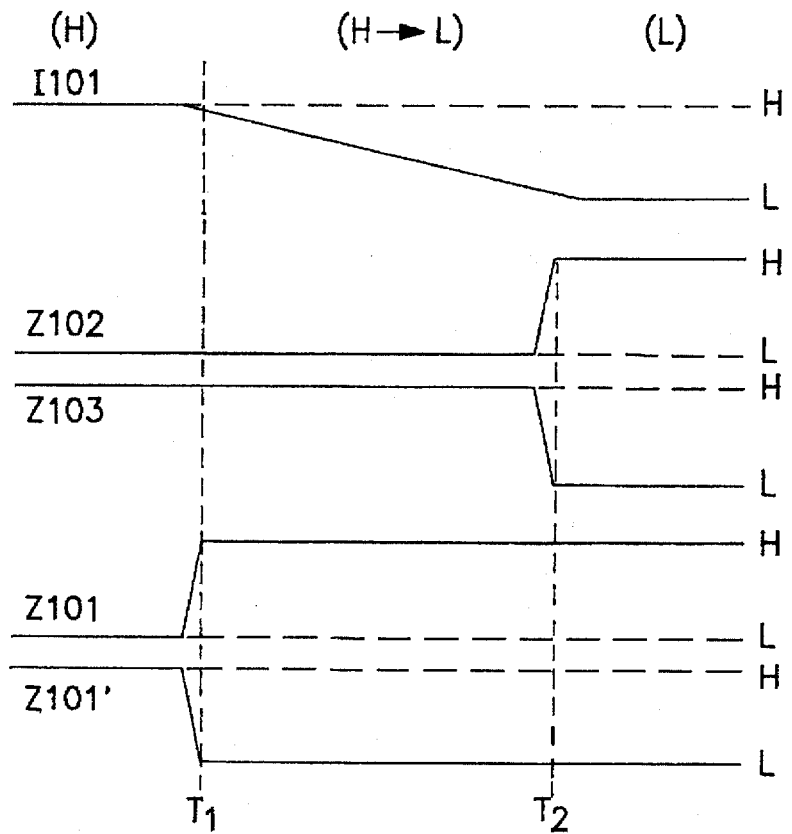

The above described driver circuitry may be established by configuring p-channel and n-channel MOS transistors only as illustrated in FIG. 4. The first control circuit C101 comprises the following four p-channel MOS transistors and four n-channel MOS transistors. A first p-channel MOS transistor T301 has a gate coupled to the input terminal I101, a source coupled to the power supply line and a drain coupled to the first output terminal Z101. A first n-channel MOS transistor T302 has a gate coupled to the input terminal I101, a source coupled to the ground line and a drain coupled to the first output terminal Z101. A second p-channel MOS transistor T304 has a gate coupled to the third output terminal Z103, a source coupled to the input terminal I101 and a drain. A second n-channel MOS transistor T303 has a gate coupled to the third out-put terminal Z103, a source coupled to the input terminal. I101 and a drain. A third p-channel MOS transistor T306 has a gate coupled to the fourth output terminal, a source coupled to the power supply line and a drain coupled to the drain of second n-channel MOS transistor T303. A third n-channel MOS transistor T305 has a gate coupled to the third output terminal Z103, a source coupled to the ground line and a drain coupled to the drain of the second p-channel MOS transistor T304. A fourth p-channel MOS transistor T308 has a gate coupled to the drain of the second n-channel MOS transistor T303, a source coupled to the power supply line and a drain coupled to the first output terminal Z101. A fourth n-channel MOS transistor T307 has a gate coupled to the drain of the second p-channel MOS transistor T304, a source coupled to the ground line and a drain coupled to the first output terminal Z101.

The second control circuit C102 comprises the following elements. A fifth p-channel MOS transistor T309 has a gate coupled to the input terminal I101, a source coupled to the power supply line and a drain. A fifth n-channel MOS transistor T312 has a gate coupled to the input terminal I101, a source coupled to the ground line and a drain. A sixth p-channel MOS transistor T310 has a gate coupled to the input terminal I101, a source coupled to the drain of the fifth p-channel MOS transistor T309 and a drain coupled to the second output terminal Z102. A sixth n-channel MOS transistor T311 has a gate coupled to the input terminal I101, a source coupled to the drain of the fifth n-channel MOS transistor T312 and a drain coupled to the second output terminal Z102. A seventh p-channel MOS transistor T313 has a gate coupled to the second output terminal Z102, a source coupled to the source of the sixth p-channel MOS transistor T310 and a drain coupled to the ground Line. A seventh n-channel MOS transistor T314 has a gate coupled to the second output terminal Z102, a source coupled to the source of the sixth n-channel MOS transistor T311 and a drain coupled to the power supply line. An eighth p-channel MOS transistor T315 has a gate coupled to the second output terminal Z102, a source coupled to the power supply line and a drain coupled to the third output terminal Z103. An eighth n-channel MOS transistor T316 has a gate coupled to the second output terminal Z102, a source coupled to the ground line and a drain coupled to the third output terminal Z103.

A second embodiment according to the present invention will be described in detail with reference to FIGS. 6, 7, 8, 9A, and 9B. A driver circuitry in a second embodiment according to the present invention will be described. The driver circuitry is connected between a power supply line which supplies a high level of voltage and a ground line which supplies the ground potential. The driver circuitry has first and second input terminals I101 and I102 for receiving an input signal of binary digits consisting of high and ground levels H and L, and first, second and third output terminals Z101, Z102 and Z103. The input signal applied to the first input terminal I101 is varied almost linearly in a first time period defined between T1 and T2 so as to be shifted between high and ground levels as illustrated in FIGS. 9A and 9B. The driver circuitry comprises first and second control circuits C101 and C102.

Figure 6:
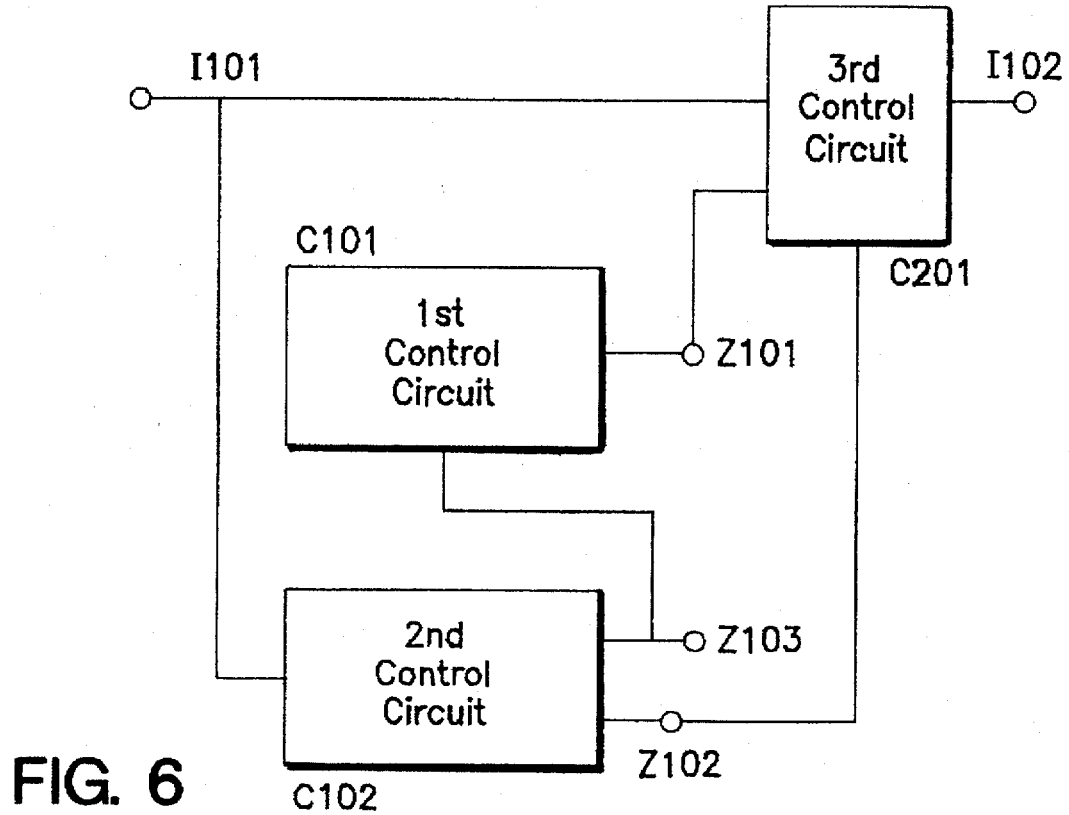
FIG. 6 is a block diagram illustrative of the essential part of a novel driver circuitry in a second embodiment according to the present invention.

As illustrated in FIG. 6, the first control circuit C101 is coupled to the input terminal I101 for receiving the input signal. The first control circuit C101 is also coupled to the first output terminal Z101 for outputting a first output signal of binary digits via the first output terminal Z101. The first control circuit C101 is connected between the power supply line not illustrated and the ground line not illustrated so as to be biased by the high level of voltage.

The second control circuit C102 is coupled to the input terminal I101 for receiving the input signal. The second control circuit C102 is also coupled to the second output terminal Z102 for outputting a second output signal of binary digits via the second output terminal Z102. The second control circuit C102 is also coupled to the third output terminal Z103 for outputting a second output signal of binary digits via the second output terminal Z103. The second control circuit C102 is connected between the power supply line not illustrated and the ground line not illustrated so as to be biased by the high level of voltage. The third output terminal is connected to the first control circuit C101.

As illustrated in FIGS. 9A and 9B, the first control circuit C101 is adjusted to switch the first output signal Z101 between the high and ground levels within an initial period of the first time period defined as between T1 and T2 and then keep the first output signal at the switched one of the ground and high levels until after the first time period expired. The first control circuit C101 is adjusted to switch the first output signal Z101 from the high level H to the low level L within the initial period by connecting the first output terminal Z101 to the power supply line and disconnecting the first output terminal Z101 from the ground line provided that the input signal I101 is switched from the ground level to the high level as illustrated in FIG. 9A.

The first control circuit C101 is also adjusted to switch the first output signal Z101 from the ground level L to the high level H within the initial period by connecting the first output terminal to the ground line and disconnecting the first output terminal from the power supply line provided that the input signal I101 is switched from the high level H to the ground level L as illustrated in FIG. 9B.

As illustrated in FIG. 9A, the second control circuit C102 is adjusted to keep the second output signal Z102 at the ground level until the time becomes T2 and then switch the second output signal Z102 from the ground level to the high level within a second time period which is so short as the initial period of the first time period defined as between T1 and T2. The second control circuit C102 is adjusted to keep the third output signal Z103 and then switch the third output signal Z103 from the high level to the ground level within the second time period by connecting the second output terminal to the ground line and disconnecting the second output terminal from the power supply line provided that the input signal I101 is switched from the ground level to the high level.

As illustrated in FIG. 9B, the second control circuit C102 is adjusted to keep the second output signal Z102 at the high level and then switch the second output signal Z102 from the high level to the low level within the second time period which is short as the initial period of the first time period defined as between T1 and T2. The second control circuit C102 is adjusted to switch the third output signal Z103 from the ground level to the high level within the second time period by connecting the third output terminal to the ground line and disconnecting the third output terminal from the power supply line provided that the input signal I101 is switched from the high level to the ground level.

As illustrated in FIG. 6, the third control circuit C103 is coupled to a fourth output terminal I101' for outputting a fourth output signal via the fourth output terminal I101'. The third control circuit C103 is also coupled to the input terminal I101 for receiving the input signal. The third control circuit C103 is also coupled to the first output terminal Z101 for receiving the first output signal Z101 from the first control circuit C101. The third control circuit C103 is also coupled to the second output terminal Z102 for receiving the second output signal from the second control circuit C102. The third control circuit C103 is biased between the power supply line and the ground line. The third control circuit C103 is adjusted to confirm, with reference to the first and second output signals Z101 and Z102, whether the input signal I101 is being switched from the ground level to the high level or switched from the high level to the ground level, so that the third control circuit C103 varies the fourth output signal I101' almost linearly within an initial half of the first time period defined as between T1 and T2 so as to switch it from the ground level to the high level if the input signal is switched from the ground level to the high level, and that the third control circuit C103 varies the fourth output signal almost linearly within the initial half of the first time period defined as between T1 and T2 so as to switch it from the high level to the ground level if the input signal is switched from the high level to the ground level. The third control circuit C103 is to receive the input signal I101 and output the fourth output signals I101' which have the same waveforms as those of the input signals I101, except that the raising time or dropping time, namely transition time is shortened as illustrated in FIGS. 9A and 9B.

Figure 7:
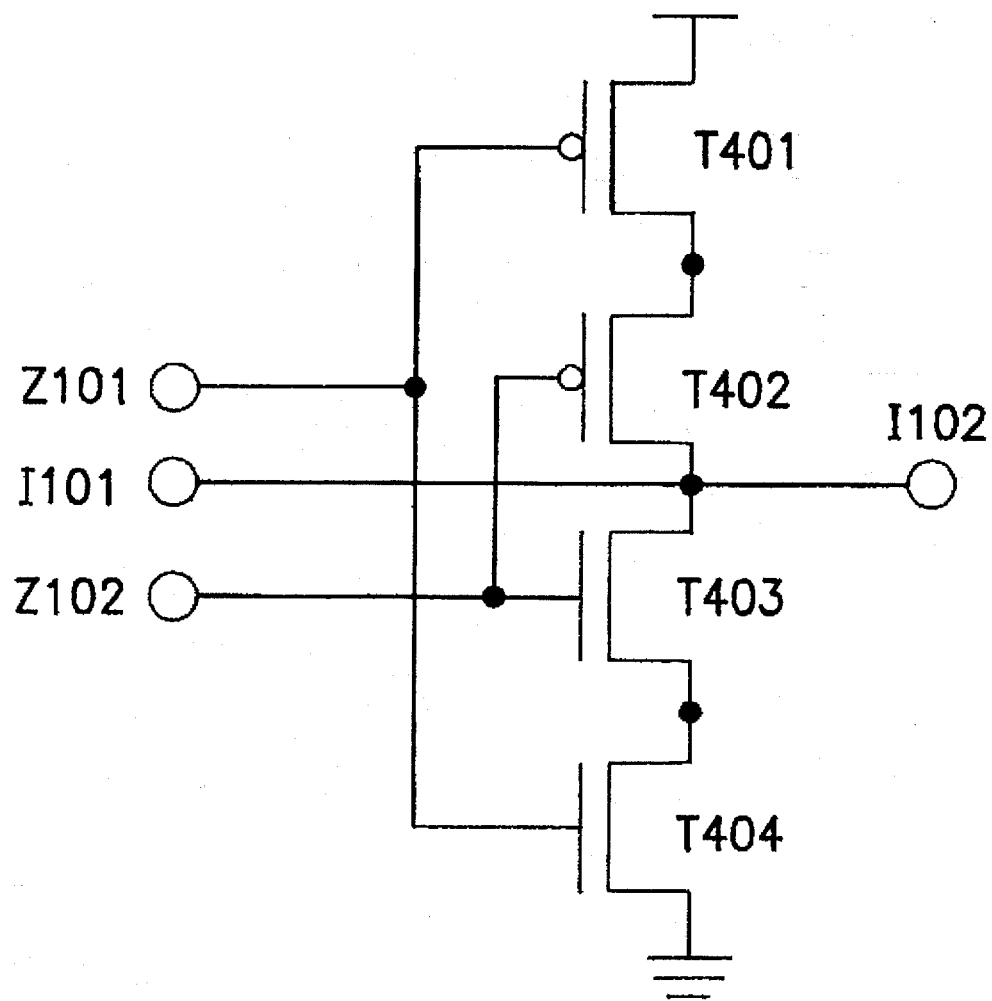
FIG. 7 is a circuit diagram illustrative of a part of a novel driver circuitry in a second embodiment according to the present invention.

The third control circuit may for example be configured as illustrated in FIG. 7. A p-channel MOS transistor T401 has a gate coupled to the first output terminal Z101, a source coupled to the power supply line and a drain. An n-channel MOS transistor T404 has a gate coupled to the first output terminal Z101, a source coupled to the ground line and a drain. A p-channel MOS transistor T402 has a gate coupled to the second output terminal Z102, a source coupled to the drain of the p-channel MOS transistor T401 and a drain coupled to the fourth output terminal I102. An n-channel MOS transistor T403 has a gate coupled to the second output terminal Z102, a source coupled to the drain of the n-channel MOS transistor T404 and a drain coupled to the fourth output terminal I102.

Figure 8:
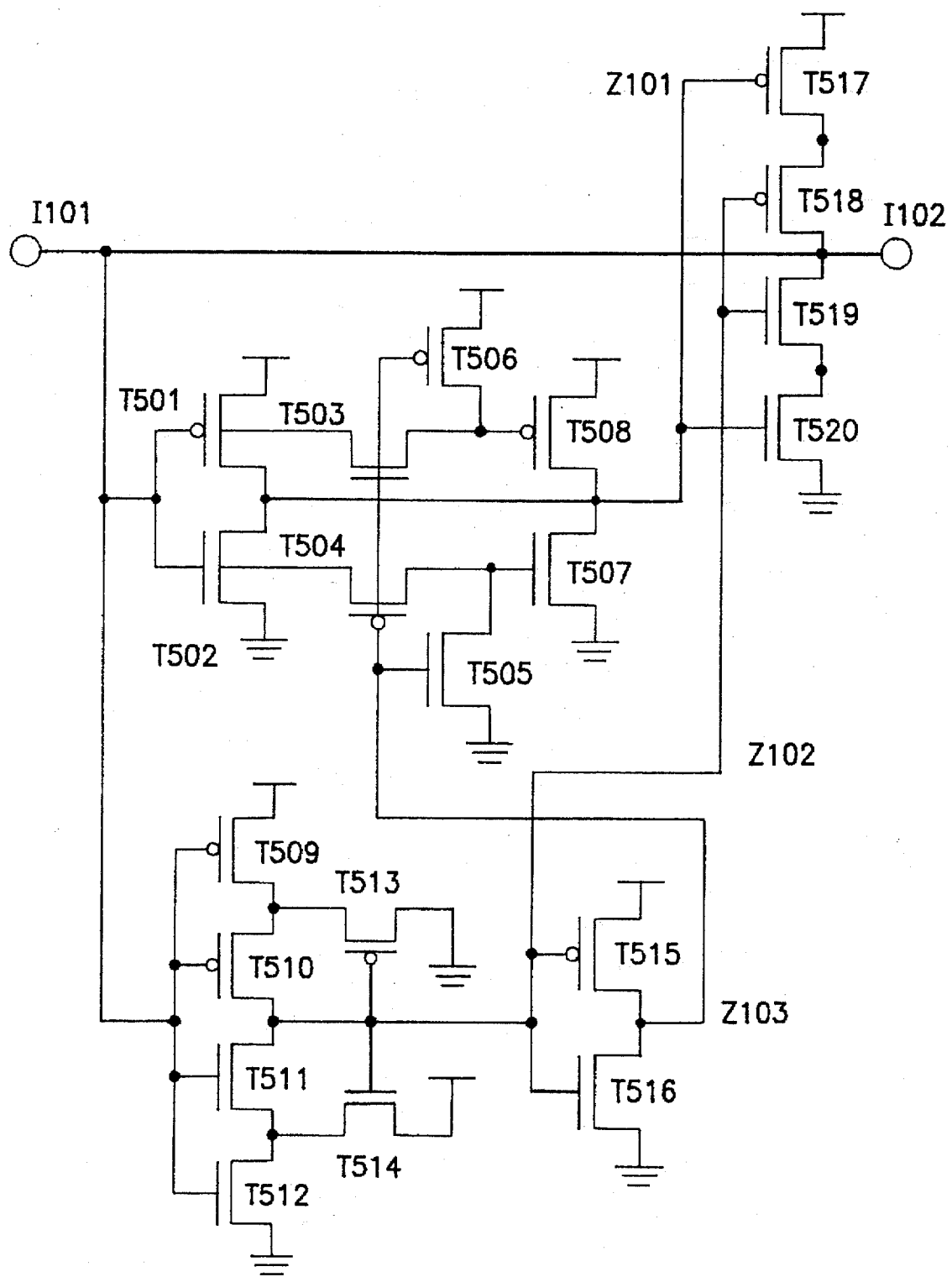
FIG. 8 is a circuit diagram illustrative of a novel driver circuitry in a second embodiment according to the present invention.
Figure 9A:
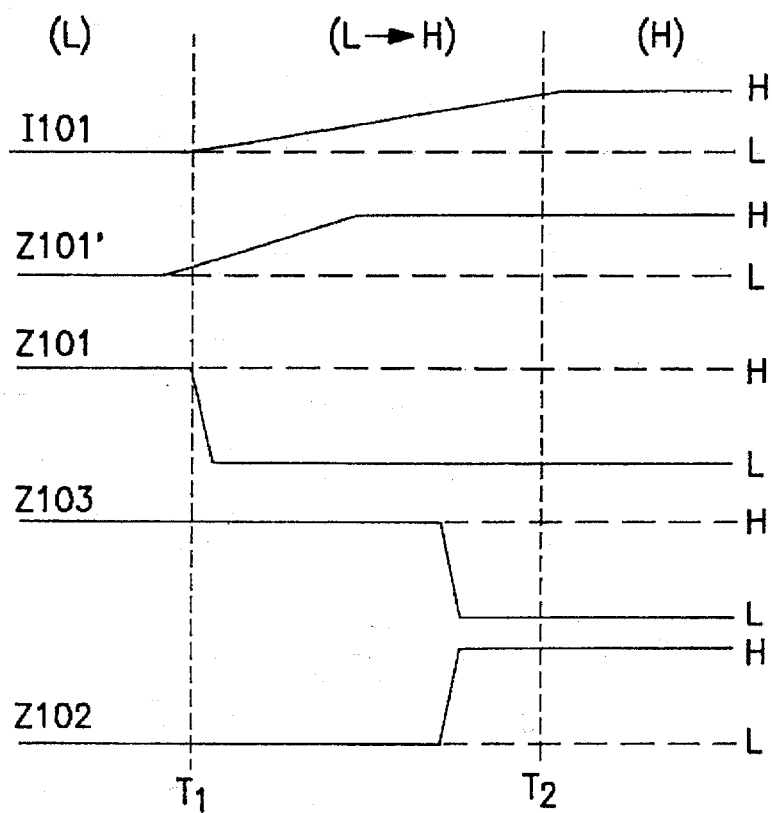
FIGS. 9A and 9B are timing charts illustrative of operations of a novel driver circuitry in a second embodiment according to the present invention.
Figure 9B:
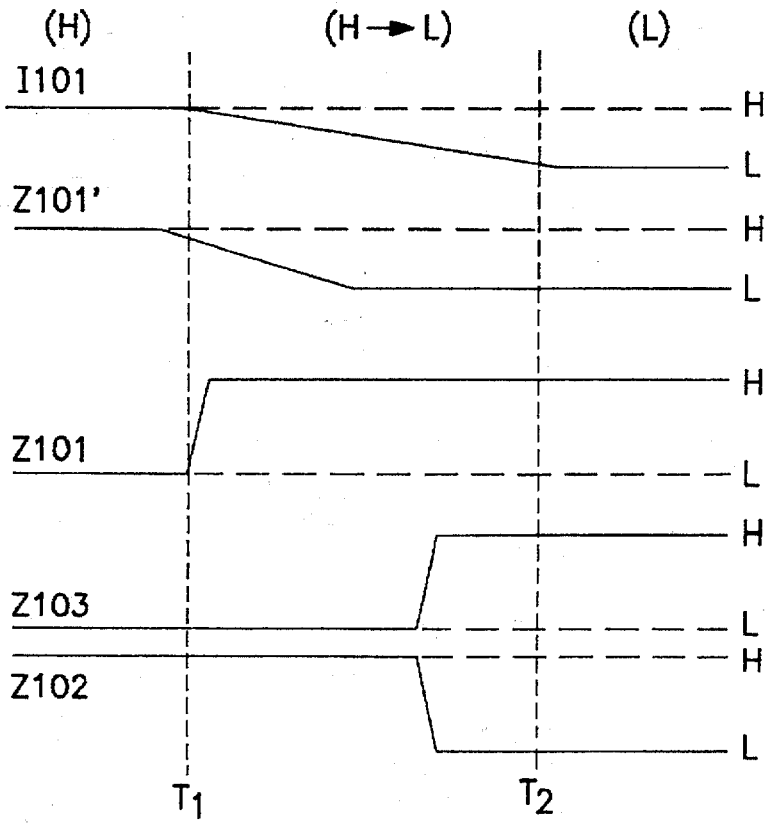

The driver circuitry of the second embodiment as described above may for example be configured as illustrated in FIG. 8. The first control circuit C101 comprises the following elements. A first p-channel MOS transistor T501 has a gate coupled to the input terminal I101, a source coupled to the power supply line and a drain coupled to the first output terminal Z101. A first n-channel MOS transistor T502 has a gate coupled to the input terminal I101, a source coupled to the ground line and a drain coupled to the first output terminal Z101. A second p-channel MOS transistor T504 has a gate coupled to the thud output terminal Z103, a source coupled to the input terminal I101 and a drain. A second n-channel MOS transistor T503 has a gate coupled to the third output terminal Z103, a source coupled to the input terminal I101 and a drain. A third p-channel MOS transistor T506 has a gate coupled to the third output terminal Z103, a source coupled to the power supply line and a drain coupled to the drain of the second n-channel MOS transistor T503. A third n-channel MOS transistor T505 has a gate coupled to the third output terminal Z103, a source coupled to the ground line and a drain coupled to the drain of the second p-channel MOS transistor T504. A fourth p-channel MOS transistor T508 has a gate coupled to the drain of the second n-channel MOS transistor T503, a source coupled to the power supply line and a drain coupled to the first output terminal Z101. A fourth n-channel MOS transistor T507 has a gate coupled to the drain of the second p-channel MOS transistor T504, a source coupled to the ground line and a drain coupled to the first output terminal Z101.

The second control circuit C102 comprises the following elements. A fifth p-channel MOS transistor T509 has a gate coupled to the input terminal I101, a source coupled to the power supply line and a drain. A fifth n-channel MOS transistor T512 has a gate coupled to the input terminal I101, a source coupled to the ground line and a drain. A sixth p-channel MOS transistor T510 has a gate coupled to the input terminal I101, a source coupled to the drain of the fifth p-channel MOS transistor T509 and a drain coupled to the second output terminal Z102. A sixth n-channel MOS transistor T511 has a gate coupled to the input terminal I101, a source coupled to the drain of the fifth n-channel MOS transistor T512 and a drain coupled to the second output terminal Z102. A seventh p-channel MOS transistor T513 has a gate coupled to the second output terminal Z102, a source coupled to the source of the sixth p-channel MOS transistor T510 and a drain coupled to the ground line. A seventh n-channel MOS transistor T514 has a gate coupled to the second output terminal Z102, a source coupled to the source of the sixth n-channel MOS transistor T510 and a drain coupled to the power supply line. An eighth p-channel MOS transistor T515 has a gate coupled to the second output terminal Z102, a source coupled to the power supply line and a drain coupled to the third output terminal Z103. An eighth n-channel MOS transistor T516 has a gate coupled to the second output terminal Z102, a source coupled to the ground line and a drain coupled to the third output terminal Z103.

The third control circuit C103 comprises the following elements. A ninth p-channel MOS transistor T517 has a gate coupled to the first output terminal Z101, a source coupled to the power supply line and a drain. A ninth n-channel MOS transistor T520 has a gate coupled to the first output terminal Z101, a source coupled to the ground line and a drain. A tenth p-channel MOS transistor T518 has a gate coupled to the second output terminal Z102, a source coupled to the drain of the ninth p-channel MOS transistor T517 and a drain coupled to the fourth output terminal I102. A tenth n-channel MOS transistor T519 has a gate coupled to the second output terminal Z102, a source coupled to the drain of the ninth n-channel MOS transistor T520 and a drain coupled to the fourth output terminal I102.

Although the above circuit configurations were merely illustrated as examples, circuit design variations are available as long as they satisfy the essential matters described in the summary of the invention.

Whereas modifications of the present invention will be apparent to a person having ordinary skill in the art, to which the invention pertains, it is to be understood that embodiments as described and shown by way of illustrations are by no means intended to be considered in a limiting sense. Accordingly, it is to be intended to cover by claims all modifications which fall within the spirit and scope of the present invention.

What is claimed is:

1. A driver circuit having a single input terminal for receiving an input signal of binary digits consisting of high and low levels, and at least first and second output terminals, said input signal being varied almost linearly in a first time period so as to be shifted between high and low levels, said driver circuitry comprising:

a first control circuit being coupled to said input terminal for receiving said input signal, said first control circuit being coupled to a third output terminal and also coupled to said first output terminal for outputting a first output signal of binary digits via said first output terminal, said first control circuit being biased between a high voltage line which supplies a high level of voltage and a low voltage line which supplies a low level of voltage, wherein said first control circuit shifts said first output signal between said high and low levels within an initial period of said first time period and then keeps said first output signal at the shifted one of said low and high levels until after said first time period expired; and a second control circuit being coupled to said input terminal for receiving said input signal, said second control circuit being also coupled to said second output terminal for outputting a second output signal of binary digits via said second output terminal, said second control circuit being biased between said high voltage line and said low voltage line, wherein said second control circuit keeps said second output signal at one level of said low and high levels at least until the time approaches the termination of said first time period and then shifts said second output signal from said one level to another level within a second time period which is as short as said initial period of said first time period, said second control circuit comprising said third output terminal, wherein said second control circuit produces a third output signal which is inverse to said second output signal, and wherein said second control circuit shifts said second output signal from said low level to said high level within said second time period provided that said input signal is shifted from said high level to said low level, and shifts said second output signal from said high level to said low level within said second time period provided that said input signal is shifted from said low level to said high level, wherein said first control circuit comprises:

a first p-channel MOS transistor having a gate coupled to said input terminal, a source coupled to said high voltage line and a drain coupled to said first output terminal;

a first n-channel MOS transistor having a gate coupled to said input terminal, a source coupled to said low voltage line and a drain coupled to said first output terminal;

a second p-channel MOS transistor having a gate coupled to said third output terminal, a source coupled to said input terminal and a drain;

a second n-channel MOS transistor having a gate coupled to said third output terminal, a source coupled to said input terminal and a drain;

a third p-channel MOS transistor having a gate coupled to said third output terminal, a source coupled to said high voltage line and a drain coupled to said drain of said second n-channel MOS transistor;

a third n-channel MOS transistor having a gate coupled to said third output terminal, a source coupled to said low voltage line and a drain coupled to said drain of said second p-channel MOS transistor;

a fourth p-channel MOS transistor having a gate coupled to drain of said n-channel MOS transistor, a source coupled to said high voltage line and a drain coupled to said first output terminal; and a fourth n-channel MOS transistor having a gate coupled to said drain of said second p-channel MOS transistor, a source coupled to said low voltage line and a drain coupled to said first output terminal, and wherein said second control circuit comprises:

a fifth p-channel MOS transistor having a gate coupled to said input terminal, a source coupled to said high voltage line and a drain;

a fifth n-channel MOS transistor having a gate coupled to said input terminal, a source coupled to said low voltage line and a drain;

a sixth p-channel MOS transistor having a gate coupled to said input terminal, a source coupled to said drain of said fifth p-channel MOS transistor and a drain coupled to said second output terminal;

a sixth n-channel MOS transistor having a gate coupled to said input terminal, a source coupled to said drain of said fifth n-channel MOS input terminal, a source coupled to said drain of said fifth n-channel MOS transistor and a drain coupled to said second output terminal;

a seventh p-channel MOS transistor having a gate coupled to said second output terminal, a source coupled to said source of said sixth p-channel MOS transistor and a drain coupled to said low voltage line;

a seventh n-channel MOS transistor having a gate coupled to said second output terminal, a source coupled to said source o said sixth n-channel MOS transistor and a drain coupled to said high voltage line;

an eighth p-channel MOS transistor having a gate coupled to said second output terminal, a source coupled to said high voltage line and a drain coupled to said third output terminal; and an eighth n-channel MOS transistor having a gate coupled to said second output terminal, a source coupled to said low voltage line and a drain coupled to said third output terminal.

2. A driver circuit having a single input terminal for receiving an input signal of binary digits consisting of high and low levels, and at least first and second output terminals, said input signal being varied almost linearly in a first time period so as to be shifted between high and low levels, said driver circuitry comprising:

a first control circuit being coupled to said input terminal for receiving said input signal, said first control circuit being coupled to a second control circuit and also coupled to said first output terminal for outputting a first output signal of binary digits via said first output terminal, said first control circuit being biased between a high voltage line which supplies a high level of voltage and a low voltage line which supplies a low level of voltage, wherein said first control circuit shifts said first output signal between said high and low levels within an initial period of said first time period and then keeps said first output signal at the shifted one of said low and high levels until after said first time period expired;

said second control circuit being coupled to said input terminal for receiving said input signal, said second control circuit being also coupled to said second output terminal for outputting a second output signal of binary digits via said second output terminal, said second control circuit being biased between said high voltage line and said low voltage line, wherein said second control circuit keeps said second output signal at one level of said low and high levels at least until the time approaches the termination of said first time period and then shifts said second output signal from said one level to another level within a second time period which is as short as said initial period of said first time period;

a third output terminal; and a third control circuit being coupled to said third output terminal for outputting a third output signal via said third output terminal, said third control circuit also being coupled to said input terminal for receiving said input signal, said third control circuit being also coupled to said first output terminal for receiving said first output signal from said first control circuit, said third control circuit being also coupled to said second output terminal for receiving said second output signal from said second control circuit, said third control circuit being biased between said high voltage line and said low voltage line, wherein said third control circuit compares said input signal with said first and second output signals, to determine whether said input signal is being shifted from said low level to said high level or shifted from said high level to said low level, so that said third control circuit varies said third output signal almost linearly within an initial half of said first time period so as to shift said third output signal from said low level to said high level if said input signal is shifted from said low level to said high level, and that said third control circuit varies said third output signal almost linearly within said initial half of said first time period so as to shift said third output signal from said high level to said low level if said input signal is shifted from said high level to said low level.

3. The driver circuitry as claimed in claim 2, further comprising a fourth output terminal being coupled to said second control circuit, wherein said second control circuit produces a fourth output signal which is inverse to said second output signal.

4. The driver circuitry as claimed in claim 3, wherein said first control circuit comprises:

a first p-channel MOS transistor having a gate coupled to said input terminal, a source coupled to said high voltage line and a drain coupled to said first output terminal;

a first n-channel MOS transistor having a gate coupled to said input terminal, a source coupled to said low voltage line and a drain coupled to said first output terminal;

a second p-channel MOS transistor having a gate coupled to said fourth output terminal, a source coupled to said input terminal and a drain;

a second n-channel MOS transistor having a gate coupled to said fourth output terminal, a source coupled to said input terminal and a drain;

a third p-channel MOS transistor having a gate coupled to said fourth output terminal, a source coupled to said high voltage line and a drain coupled to said drain of said second n-channel MOS transistor;

a third n-channel MOS transistor having a gate coupled to said fourth output terminal, a source coupled to said low voltage line and a drain coupled to said drain of said second p-channel MOS transistor;

a fourth p-channel MOS transistor having a gate coupled to said drain of said second n-channel MOS transistor, a source coupled to said high voltage line and a drain coupled to said first output terminal; and a fourth n-channel MOS transistor having a gate coupled to said drain of said second p-channel MOS transistor, a source coupled to said low voltage line and a drain coupled to said first output terminal, wherein said second control circuit comprises:

a fifth p-channel MOS transistor having a gate coupled to said input terminal, a source coupled to said high voltage line and a drain;

a fifth n-channel MOS transistor having a gate coupled to said input terminal, a source coupled to said low voltage line and a drain;

a sixth p-channel MOS transistor having a gate coupled to said input terminal, a source coupled to said drain of said fifth p-channel MOS transistor and a drain coupled to said second output terminal;

a sixth n-channel MOS transistor having a gate coupled to said input terminal, a source coupled to said drain of said fifth n-channel MOS transistor and a drain coupled to said second output terminal;

a seventh p-channel MOS transistor having a gate coupled to said second output terminal, a source coupled to said source of said sixth p-channel MOS transistor and a drain coupled to said low voltage line;

a seventh n-channel MOS transistor having a gate coupled to said second output terminal, a source coupled to said source of said sixth n-channel MOS transistor and a drain coupled to said high voltage line;

an eighth p-channel MOS transistor having a gate coupled to said second output terminal, a source coupled to said high voltage line and a drain coupled to said fourth output terminal; and an eighth n-channel MOS transistor having a gate coupled to said second output terminal, a source coupled to said low voltage line and a drain coupled to said fourth output terminal, and wherein said third control circuit comprises:

a ninth p-channel MOS transistor having a gate coupled to said first output terminal, a source coupled to said high voltage line and a drain;

a ninth n-channel MOS transistor having a gate coupled to said first output terminal, a source coupled to said low voltage line and a drain;

a tenth p-channel MOS transistor having a gate coupled to said second output terminal, a source coupled to said drain of said ninth p-channel MOS transistor and a drain coupled to said third output terminal; and a tenth n-channel MOS transistor having a gate coupled to said second output terminal, a source coupled to said drain of said ninth n-channel MOS transistor and a drain coupled to said third output terminal.

5. A driver circuit being connected between a power supply line which supplies a high level of voltage and a ground line which supplies the ground potential, said driver circuitry having a single input terminal for receiving an input signal of binary digits consisting of high and ground levels, and at least first and second output terminals, said input signal being varied almost linearly in a first time period so as to be shifted between high and ground levels, and at least first and second output terminals, said input signal being varied almost linearly in a first time period so as to be shifted between high and ground levels, said driver circuitry comprising:

a first switching circuit being coupled to said input terminal for receiving said input signal, said first switching circuit being coupled to a third output terminal and also coupled to said first output terminal for outputting a first output signal of binary digits via said first output terminal, said first switching circuit being connected between said power supply line and said ground line so as to be biased by said high level of voltage, wherein said first switching circuit is adjusted to switch said first output signal between said high and ground levels within an initial period of said first time period and then keeps said first output signal at the switched one of said ground and high levels until after said first time period expired;

a second switching circuit being coupled to said input terminal for receiving said input signal, said second switching circuit being also coupled to said second output terminal for outputting a second output signal of binary digits via said second output terminal, said second switching circuit being connected between said power supply line and said ground line so as to be biased by said high level of voltage, wherein said second switching circuit is adjusted to keep said second output signal at one level of said ground and high levels at least until the time approaches the termination of said first time period and then switch said second output signal from said one level to another level within a second time period which is as short as said initial period of said first time period, wherein said second switching circuit switches said second output signal from said ground level to said high level within said second time period by connecting said first output terminal to said power supply line and disconnecting said first output terminal from said ground line provided that said input signal is switched from said high level to said ground level, and switches said second output signal from said high level to said ground level within said second time period by connecting said first output terminal to said ground line and disconnecting said first output terminal from said power supply line provided that said input signal is switched from said ground level to said high level; and said third output terminal being coupled to said second switching circuit, wherein said second switching circuit produces a third output signal which is inverse to said second output signal;

wherein said first switching circuit comprises:

a first p-channel MOS transistor having a gate coupled to said input terminal, a source coupled to said power supply line and a drain coupled to said first output terminal;

a first n-channel MOS transistor having a gate coupled to said input terminal, a source coupled to said ground line and a drain coupled to said first output terminal;

a second p-channel MOS transistor having a gate coupled to said third output terminal, a source coupled to said input terminal and a drain;

a second p-channel MOS transistor having a gate coupled to said third output terminal, a source coupled to said input terminal and a drain;

a third p-channel MOS transistor having a gate coupled to said third output terminal, a source coupled to said power supply line and a drain coupled to said drain of said second n-channel MOS transistor;

a third n-channel MOS transistor having a gate coupled to said third output terminal, a source coupled to said ground line and a drain coupled to said drain of said second p-channel MOS transistor;

a fourth p-channel MOS transistor having a gate coupled to said drain of said second n-channel MOS transistor, a source coupled to said power supply line and a drain coupled to said first output terminal; and a fourth n-channel MOS transistor having a gate coupled to said drain of said second p-channel MOS transistor, a source coupled to said ground line and a drain coupled to said first output terminal, and wherein said second switching circuit comprises:

a fifth p-channel MOS transistor having a gate coupled to said input terminal, a source coupled to said power supply line and a drain;

a fifth n-channel MOS transistor having a gate coupled to said input terminal, a source coupled to said ground line and a drain;

a sixth p-channel MOS transistor having a gate coupled to said input terminal, a source coupled to said drain of said fifth p-channel MOS transistor and a drain coupled to said second output terminal;

a sixth n-channel MOS transistor having a gate coupled to said input terminal, a source coupled to said drain of said fifth n-channel MOS transistor and a drain coupled to said second output terminal;

a seventh p-channel MOS transistor having a gate coupled to said second output terminal, a source coupled to said source of said sixth p-channel MOS transistor and a drain coupled to said ground line;

a seventh n-channel MOS transistor having a gate coupled to said second output terminal, a source coupled to said source of said sixth n-channel MOS transistor and a drain coupled to said power supply line;

an eighth p-channel MOS transistor having a gate coupled to said second output terminal, a source coupled to said power supply line and a drain coupled to said third output terminal; and an eighth n-channel MOS transistor having a gate coupled to said second output terminal, a source coupled to said ground line and a drain coupled to said third output terminal.

6. A driver circuit being connected between a power supply line which supplies a high level of voltage and a ground line which supplies the ground potential, said driver circuitry having a single input terminal for receiving an input signal of binary digits consisting of high and ground levels, and at least first and second output terminals, said input signal being varied almost linearly in a first time period so as to be shifted between high and ground levels, and at least first and second output terminals, said input signal being varied almost linearly in a first time period so as to be shifted between high and ground levels, said driver circuitry comprising:

a first switching circuit being coupled to said input terminal for receiving said input signal, said first switching circuit being a second switching circuit and also coupled to said first output terminal for outputting a first output signal of binary digits via said first output terminal, said first switching circuit being connected between said power supply line and said ground line so as to be biased by said high level of voltage, wherein said first switching circuit is adjusted to switch said first output signal between said high and ground levels within an initial period of said first time period and then keeps said first output signal at the switched one of said ground and high levels until after said first time period expired;

said second switching circuit being coupled to said input terminal for receiving said input signal, said second switching circuit being also coupled to said second output terminal for outputting a second output signal of binary digits via said second output terminal, said second switching circuit being connected between said power supply line and said ground line so as to be biased by said high level of voltage, wherein said second switching circuit is adjusted to keep said second output signal at one level of said ground and high levels at least until the time approaches the termination of said first time period and then switch said second output signal from said one level to another level within a second time period which is as short as said initial period of said first time period;

a third output terminal; and a third switching circuit being coupled to said third output terminal for outputting a third output signal via said third output terminal, said third switching circuit also being coupled to said input terminal for receiving said input signal, said third switching circuit being also coupled to said first output terminal for receiving said first output signal from said first switching circuit, said third switching circuit being also coupled to said second output terminal for receiving said second output signal from said second switching circuit, said third switching circuit being biased between said power supply line and said ground line, wherein said third switching circuit confirms, with reference to said first and second output signals whether said input signal is being switched from said ground level to said high level or switched from said high level to said ground level, so that said third switching circuit varies said third output signal almost linearly within an initial half of said first time period so as to switch said third output signal from said ground level to said high level if said input signal is switched from said ground level to said high level, and that said third switching circuit varies said third output signal almost linearly within said initial half of said first time period so as to switch said third output signal from said high level to said ground level if said input signal is switched from said high level to said ground level.

7. The driver circuitry as claimed in claim 6 further comprising a fourth output terminal being coupled to said second switching circuit, wherein said second switching circuit is adjusted to output a fourth output signal which is inverse to said second output signal.

8. The driver circuitry as claimed in claim 7, wherein said first switching circuit comprises:

a first p-channel MOS transistor having a gate coupled to said input terminal, a source coupled to said power supply line and a drain coupled to said first output terminal;

a first n-channel MOS transistor having a gate coupled to said input terminal, a source coupled to said ground line and a drain coupled to said first output terminal;

a second p-channel MOS transistor having a gate coupled to said fourth output terminal, a source coupled to said input terminal and a drain;

a second n-channel MOS transistor having a gate coupled to said fourth output terminal, a source coupled to said input terminal and a drain;

a third p-channel MOS transistor having a gate coupled to said fourth output terminal, a source coupled to said power supply line and a drain coupled to said drain of said second n-channel MOS transistor;

a third n-channel MOS transistor having a gate coupled to said fourth output terminal, a source coupled to said ground line and a drain coupled to said drain of said second p-channel MOS transistor;

a fourth p-channel MOS transistor having a gate coupled to said drain of said second n-channel MOS transistor, a source coupled to said power supply line and a drain coupled to said first output terminal; and a fourth n-channel MOS transistor having a gate coupled to said drain of said second p-channel MOS transistor, a source coupled to said ground line and a drain coupled to said first output terminal, wherein said second switching circuit comprises:

a fifth p-channel MOS transistor having a gate coupled to said input terminal, a source coupled to said power supply line and a drain;

a fifth n-channel MOS transistor having a gate coupled to said input terminal, a source coupled to said ground line and a drain;

a sixth p-channel MOS transistor having a gate coupled to said input terminal, a source coupled to said drain of said fifth p-channel MOS transistor and a drain coupled to said second output terminal;

a sixth n-channel MOS transistor having a gate coupled to said input terminal, a source coupled to said drain of said fifth n-channel MOS transistor and a drain coupled to said second output terminal;

a seventh p-channel MOS transistor having a gate coupled to said second output terminal, a source coupled to said source of said sixth p-channel MOS transistor and a drain coupled to said ground line;

a seventh n-channel MOS transistor having a gate coupled to said second output terminal, a source coupled to said source of said sixth n-channel MOS transistor and a drain coupled to said power supply line;

an eighth p-channel MOS transistor having a gate coupled to said second output terminal, a source coupled to said power supply line and a drain coupled to said fourth output terminal; and an eighth n-channel MOS transistor having a gate coupled to said second output terminal, a source coupled to said ground line and a drain coupled to said fourth output terminal, and wherein said third switching circuit comprises:

a ninth p-channel MOS transistor having a gate coupled to said first output terminal, a source coupled to said power supply line and a drain;

a ninth n-channel MOS transistor having a gate coupled to said first output terminal, a source coupled to said ground line and a drain;

a tenth p-channel MOS transistor having a gate coupled to said second output terminal, a source coupled to said drain of said ninth p-channel MOS transistor and a drain coupled to said third output terminal; and a tenth n-channel MOS transistor having a gate coupled to said second output terminal, a source coupled to said drain of said ninth n-channel MOS transistor and a drain coupled to said third output terminal.

* * * * *